United States Patent
Leibovitz et al.

[11] Patent Number: 5,162,260
[45] Date of Patent: Nov. 10, 1992

[54] STACKED SOLID VIA FORMATION IN INTEGRATED CIRCUIT SYSTEMS

[75] Inventors: Jacques Leibovitz, San Jose; Maria L. Cobarruviaz, Cupertino; Kenneth D. Scholz, Palo Alto; Clinton C. Chao, Redwood City, all of Calif.

[73] Assignee: Hewlett-Packard Company, Palo Alto, Calif.

[21] Appl. No.: 638,885

[22] Filed: Jan. 7, 1991

Related U.S. Application Data

[63] Continuation-in-part of Ser. No. 360,828, Jun. 1, 1989, Pat. No. 5,055,425.

[51] Int. Cl.$^5$ .................................... H01L 21/44
[52] U.S. Cl. .................... 437/195; 437/189; 437/192; 437/203; 437/228; 437/246; 437/978
[58] Field of Search .......... 437/195, 228, 235, 245, 437/246, 203, 189, 915, 978, 203, 192, 190; 148/DIG. 164; 156/643, 644, 645, 650

[56] References Cited

U.S. PATENT DOCUMENTS

| | | | |
|---|---|---|---|
| 4,067,104 | 1/1978 | Tracy | 29/626 |
| 4,523,372 | 6/1985 | Balda et al. | 29/590 |
| 4,612,083 | 9/1986 | Yasumoto et al. | 156/633 |
| 4,666,737 | 5/1987 | Gimpelson et al. | 437/245 |
| 4,700,465 | 10/1987 | Sirkin | 437/189 |
| 4,710,398 | 12/1987 | Homma et al. | 437/235 |
| 4,721,689 | 1/1988 | Chaloux, Jr. et al. | 437/189 |
| 4,767,724 | 8/1988 | Kim | 437/195 |
| 4,824,802 | 4/1989 | Brown et al. | 437/245 |
| 4,829,018 | 5/1989 | Wahlstrom | 437/51 |
| 4,840,923 | 6/1989 | Flagello et al. | 437/189 |
| 4,879,257 | 11/1989 | Patrick | 437/195 |

Primary Examiner—Brian E. Hearn
Assistant Examiner—Tuan Nguyen

[57] ABSTRACT

A method of forming solid copper vias in a dielectric layer permits stacked vias in a multi-chip carrier. A dielectric layer is deposited over a substrate and lines of a first interconnect layer formed on the substrate. An aperture formed in the dielectric layer is filled with copper by deposition to form a hollow via. Using a photoresist mask, the hollow via is filled solid by electroplating a second amount of copper. The photoresist is then stripped and excess copper extending from the via is polished flat. A second interconnect layer can be formed on the resulting structure. The foregoing steps can be iterated to build a multi-layer structure with stacked vias.

6 Claims, 7 Drawing Sheets

STACKED SOLID VIA FORMATION IN INTEGRATED CIRCUIT SYSTEMS

BACKGROUND OF THE INVENTION

The present application is a continuation-in-part of a U.S. application, Ser. No. 07/360,828, filed Jun. 1, 1989, now U.S. Pat. No. 5,055,425. The present invention relates to integrated circuits and, more particularly, to a method of forming stacked solid vias, and to structures resulting from the method. A major objective of the present invention is to provide for high-density multi-chip carriers.

Much of recent technological progress embraces the increasing miniaturization afforded by advances in integrated circuit processing technology. Dramatic improvements in the circuit density available on individual integrated circuit chips have been made. Typically, integrated circuit chips are individually packaged and the packages are mounted on printed circuit boards. The sizes of the packages limit chip density on the printed circuit board, requiring larger systems and limiting overall circuit performance due to longer inter-chip connections.

More recently, multi-chip carriers have been developed which permit multiple integrated circuit chips to be mounted on a common carrier without the need for packaging the individual chips. This allows the chips to be packed more closely together.

While multi-chip carriers have been fabricated using a variety of technologies, the greatest chip density has been achieved by multi-chip carriers fabricated using integrated circuit processing technology. In other words, a multi-chip carrier can be fabricated by photolithographically defining multiple layers of circuits interconnected by metal vias through intermediate dielectric layers. Individual integrated circuit chips attach to the upper layer of the multi-chip carrier and receive and transmit electrical signals through the multi-chip carrier's circuit layers and vias.

The vias which carry electrical signals from one circuitry layer to another are typically formed as follows. Apertures are photolithographically defined in a dielectric layer deposited over a lower circuit layer. Copper vias are then formed in these apertures by sputtering or by chemical vapor deposition. Copper is the preferred via material because of its excellent conductivity and current-carrying capacity, however copper requires a distinct adhesive layer, e.g., chromium, to bond the copper to the dielectric. Aluminum bonds readily with dielectrics without an intermediate adhesive layer, and for this reason is also sometimes used.

The vias formed by conventional sputtering or chemical vapor deposition are hollow. Hollow vias cannot be stacked through successive layers because of attendant photolithographic difficulties. Specifically, a photoresist layer follows the curvature of the hollow via's surface. The resulting curvature causes deviations in the collimated light beam used to define patterns in the photoresist; these deviations prevent certain regions of the photoresist from being exposed, and conversely, expose other regions that must not be exposed, so that the desired pattern for the next circuitry layer cannot be formed.

To address these problems, vias can be offset through individual layers to provide multi-layer interconnections. The pattern of vias through the individual circuit layers resembles a set of steps, which require extra space. The spreading of the vias across the layers limits the circuit density of the carrier and thus the density with which chips can be arranged on the carrier. In addition, the less dense arrangement requires longer signal paths, characterized by higher impedance and longer signal travel time.

What is needed is a method of fabricating a multi-chip carrier that provides for greater density in the arrangement of the integrated circuit chip carrier. More specifically, what is needed it a method of fabricating stacked vias compatible with integrated circuit processing technology.

SUMMARY OF THE INVENTION

In accordance with the present invention, an integrated circuit device comprises a substrate having a circuit pattern deposited on its surface, and a dielectric layer deposited upon the circuit pattern. The dielectric layer contains a plurality of solid conductive vias which traverse the thickness of the dielectric layer, allowing vertical connections to other circuit patterns and further similar dielectric layers. In accordance with the present invention method, hollow vias are first electroplated through etched openings in a dielectric separation layer. These hollow vias are then filled with further electroplating material, yielding solid vias which when polished provide planar upper surfaces for fabricating further circuit lines, another dielectric layer and additional solid vias. The method provides for the formation of solid vias which can be stacked. Preferably, the vias formed are of copper, however, the method also provides for the formation of vias formed of other highly conductive metals such as silver, gold, aluminum and platinum.

The first step of the method is to form a circuit pattern on a substrate. This can be done using conventional photolithographic techniques. In a second step, a dielectric layer is deposited over the substrate and circuit pattern. Photoresist is applied, as a third step, over the dielectric layer, and apertures are defined photolithographically and etched through the dielectric layer, after which the photoresist is stripped In a fourth step, the whole surface including the apertures is covered by plating a highly conductive metal to form hollow first dielectric layer vias. Preferably, electroplating is used, but the invention provides for electroless plating as well. The preferred highly conductive material is copper. However, copper does not effectively bond to the dielectric material surrounding the vias. Accordingly, metal adhesive layers can be deposited before and after the copper conductive layer to ensure proper bonding with adjacent dielectric materials. For example, chromium can be used to ensure adequate bonding between the copper and the surrounding dielectric material.

Since the electroplating process does not result in solid vias, the next steps fill vias to achieve solid vias through the dielectric layer. In a fifth step, photoresist is applied over the electroplated metal layer. Apertures are defined through the photoresist to expose the regions of the hollow vias. In a sixth step, the exposed hollow vias are filled by electroplating a second amount of copper material. The seventh, final step removes the photoresist layer and any excess metal from the top of the vias, leaving a planarized metal layer atop the dielectric layer containing the solid vias.

The planarized metal layer now is patterned by conventional photolithography to form a second electrical circuit layer directly above the structure created by the above-described procedure. This second circuit layer includes circuit layer lines laying across and electrically attached to a portion of the first dielectric layer vias. A second dielectric layer including vias stacked over the conductive traces of the second circuit layer can be fabricated in the manner of the first dielectric layer. Subsequent circuit and dielectric layers can be similarly fabricated, resulting in a multilayer structure with vertical interconnects, or vias, through several layers.

Since multilayer interconnects can be formed with stacked solid vias, rather than relying on offset hollow vias, greater circuit density can be achieved in a multichip carrier. Moreover, since stacked vias minimize interconnect lengths, impedance and signal travel time are minimized. Furthermore, the stacked vias provide for more effective heat transfer from the mounted integrated circuit chips. Because of the heat-transfer characteristics of stack vias, they can be used as "studs" for heat removal, even where they are not required for electrical interconnection. These and other features and advantages of the present invention are apparent from the description below with reference to the following drawings.

DESCRIPTION OF THE PREFERRED EMBODIMENTS

Figure 1:
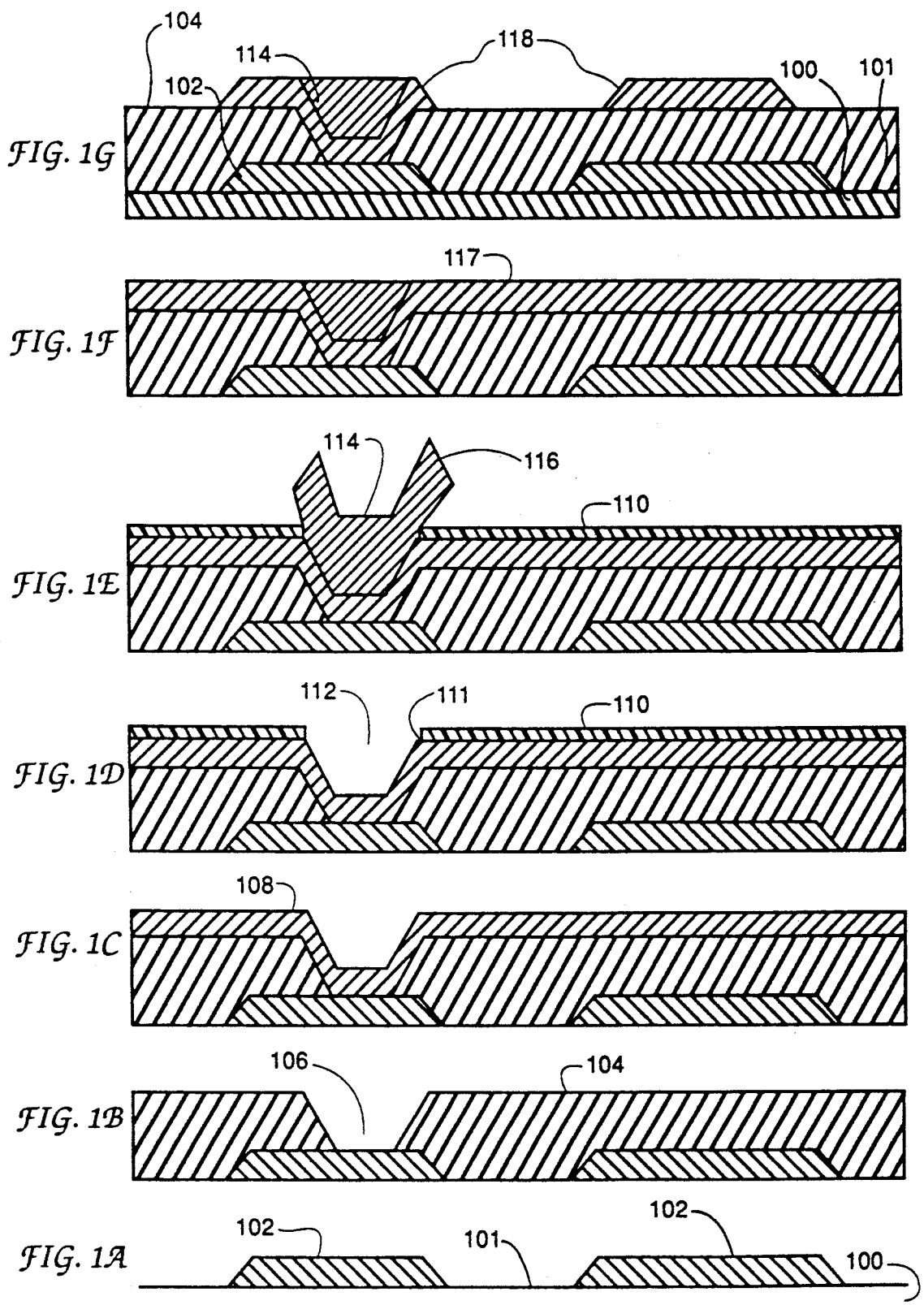
FIGS. 1A–1G illustrate the cross section of the product at successive steps of the process in accordance with the present invention.

In accordance with the present invention, an integrated circuit device FIG. 1G comprises a substrate 100 having a circuit pattern 102 deposited on its surface 101, and an intermediate dielectric layer 104 deposited upon the circuit pattern. The dielectric layer contains a plurality of solid conductive vias 114 which traverse the thickness of the dielectric layer, allowing vertical connection to other circuit patterns 118 and further similar dielectric layers. In accordance with the present invention, a method for forming solid copper vias which can be stacked is illustrated in FIGS. 1A–1G. Steps of the method are given in the accompanying flow diagram of FIG. 2. FIG. 1A represents a starting point for the present invention and shows copper (Cu) lines 102 formed on a silicon substrate 100 (not shown), the upper surface 101 of which has been oxidized to form a silica layer. A thin chromium (Cr) layer can be used to bond copper lines 102 to surface 101.

A relatively thick polyimide layer is deposited over copper lines 102 and cured to form an intermediate dielectric layer 104. Using conventional photolithographic techniques, apertures 106 are formed through the entire depth of the intermediate dielectric layer 104 over portions of copper lines 102, as shown in FIG. 1B, to allow access for electrical connection to copper lines 102. Next, a composite layer 108 is formed over the surface of polyimide layer 104, partially filling apertures 106 with copper, resulting in the structure of FIG. 1C. Composite layer 108 comprises a copper center sandwiched between chromium adhesion layers. A photoresist layer 110 is then deposited over the structure of FIG. 1C. Using standard photolithographic techniques, apertures 111 are formed through photoresist layer 110, exposing copper cup 112 in order to define the location for a subsequently formed solid via, as shown in FIG. 1D.

Cup 112 is then filled with copper to form solid via 114 in an electroplating step, resulting in the structure of FIG. 1E. A polishing step removes excess copper 116 and photoresist layer 110 so that the via top surface 117 is planar as indicated in FIG. 1F. Using photolithographic techniques, upper composite layer surface 117 can be patterned to form an upper layer of conductive circuit traces 118, connected by solid vias 114 to the lower layer of conductive traces 102, as shown in FIG. 1G.

The structure of FIG. 1G can become the substrate for the next iteration of the procedure. A second dielectric layer with vias therethrough can be formed using a second iteration of the process described with reference to FIGS. 1B–1G. After several iterations, the resulting structure comprises alternating circuit layers and dielectric layers, connected with solid vias. FIGS. 4 and 5 show cross sections of solid copper vias, 40 $\mu m$ in diameter, built in a polyimide/copper structure by the described via fabrication method.

In accordance with the present invention, the solid copper vias or studs are first made in the shape of cups, then are filled and overfilled with copper, to be finally polished back to the required level. The corresponding steps of the process are recapitulated below. An alternative embodiment of the invention then follows. As described, the cross sections of the product corresponding to the successive steps of the present invention are illustrated in FIG. 1, while the method steps are provided in the flow diagram of FIG. 2.

Figure 2:
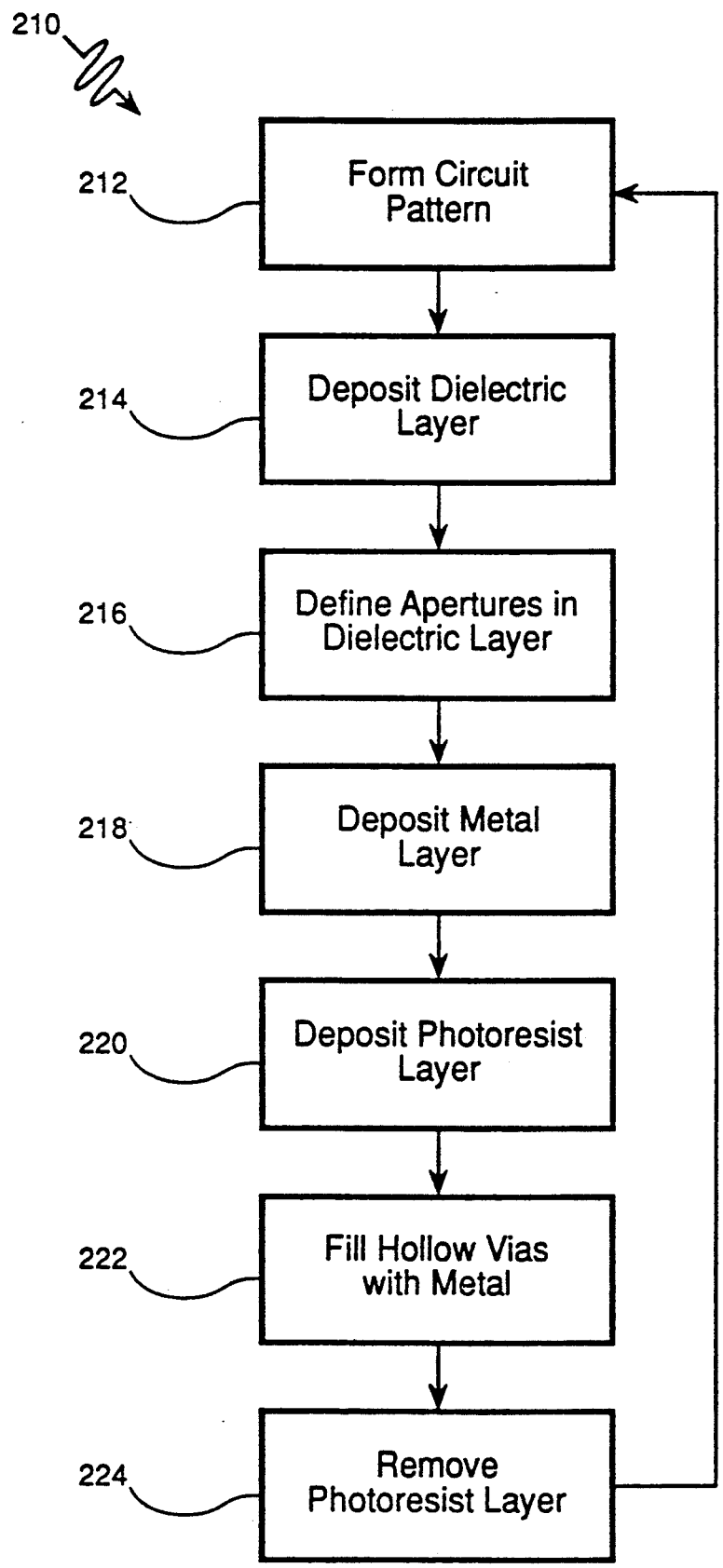
FIG. 2 is a flow diagram illustrating stages in the fabrication of a structure including a solid copper via in accordance with the present invention.
Figure 3G:
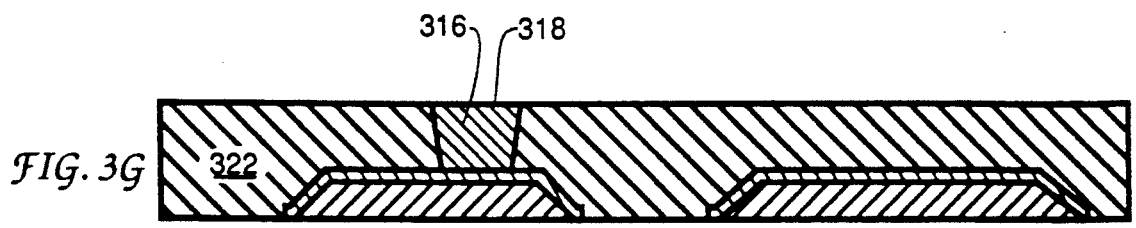
FIGS. 3A–3G represent stages in the fabrication of a structure including a solid copper via in accordance with an alternative embodiment of the present invention.
Figure 3F:
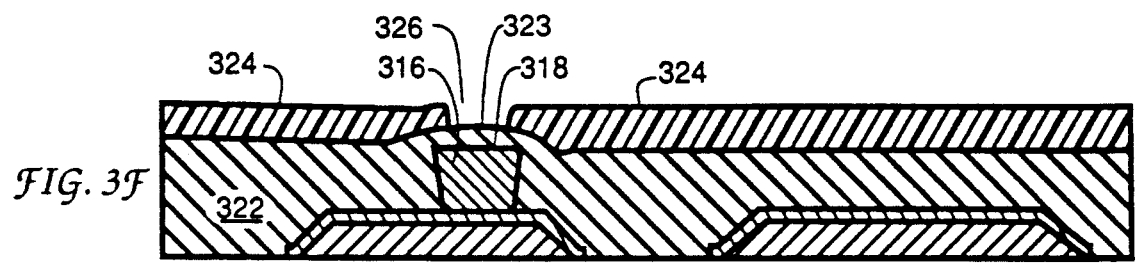
Figure 3E:
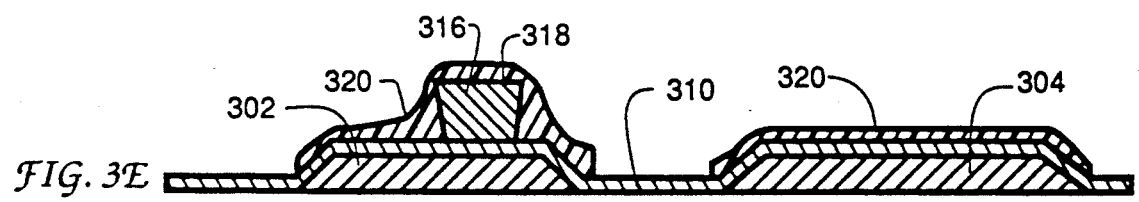
Figure 3D:
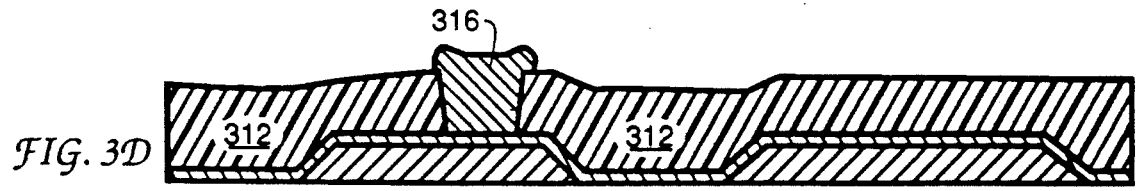
Figure 3C:
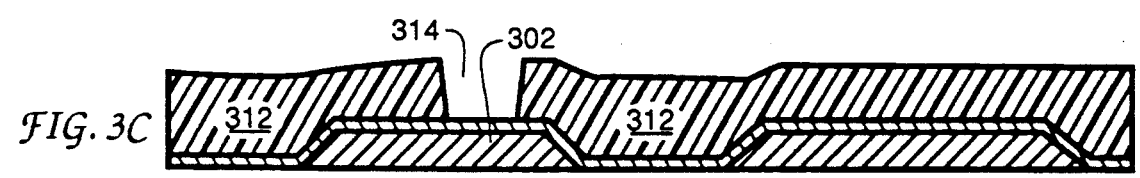
Figure 3B:
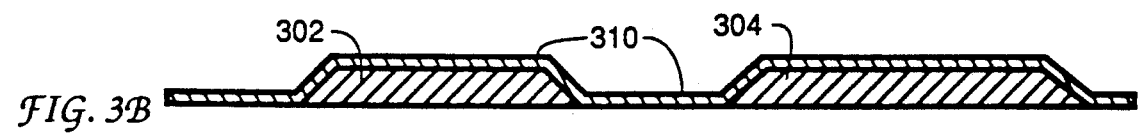
Figure 3A:
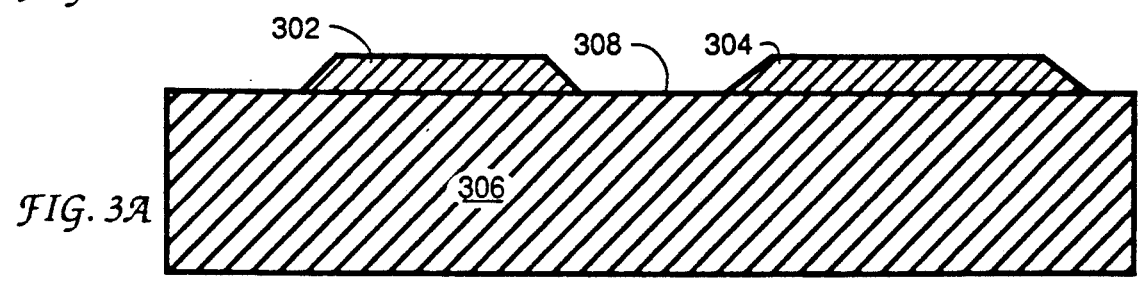

Consider the nth method layer 102 of a polyimide/copper structure shown in FIG. 1A, deposited as a circuit pattern, step 212 FIG. 2. The next layer and the cup-shaped vias connecting between these two layers can be formed by first fabricating, steps 214 and 216, a cured polyimide layer 104 with via apertures 106, FIG.

1B, and then depositing, step 218, a Cr/Cu/Cr metallization 108, FIG. 1C. The two 0.05 μm thick chromium layers provide adhesion. Ordinarily, in the prior art the metal layer is patterned by masking and etching, leaving the (n+1)th metal layer and cup-shaped, hollow vias connecting downward to the nth layer.

In order to provide solid vias, allowing denser and stackable inter-layer connections, the present invention fills the copper cups before the patterning of the (n+1)th metal layer. The present invention method starts at the procedural point represented in FIG. 1C, and follows the step given below.

A. Mask the (n+1)th metallization layer 108 with photoresist 110 (i.e., spin, dry, expose, develop, and hard bake a photoresist layer) to expose the copper cups 112, FIG. 1D, step 220 FIG. 2, through an aperture 111.

B. Etch the top chromium layer of the (n+1)th metallization layer 108 left exposed in previous step.

C. Electroplate copper 114 to fill the cups, step 222, FIG. 2 (note the resulting overfill of copper 116 shown in FIG. 1E).

D. Strip the remaining photoresist 110 and polish the overfill of copper 116, FIG. 1F, step 224, FIG. 2, using an appropriate planarization process as discussed below.

E. When needed, 0.05 μm of chromium can be deposited to cover the upper copper surface 117 for adhesion to further layers.

The topmost Cr/Cu/Cr metallization surface 117 can then be patterned to complete the (n+1)th metal layer 118, FIG. 1G. Each following layer of metal, dielectrics and vias can be fabricated similarly, by repeating fabrication steps 212 through 224.

FIGS. 4 and 5 show cross sections of solid copper vias, 40 μm in diameter, built in a polyimide/copper structure by the described fabrication method.

In accordance with the invention, stacked solid copper vias and heat-conducting studs in polyimide/copper structures can also be fabricated by an alternative method to provide high-performance multi-chip modules (MCMs). The cross sections of the product corresponding to the successive steps are illustrated in FIGS. 3A–G. The first metal layer 302, 304 can be formed over substrate 306 by first depositing a Cr/Cu/Cr metallization, FIG. 3A, then patterning it by masking with photoresist, selective etching of the successive metals and stripping the photoresist. The two chromium layers are 0.05 μm thick and provide adhesion. In accordance with the invention, the Cr/Cu/Cr metallization for the first metal layer is formed such that the solid copper vias and studs are formed before the bottom metal layer (providing electrical connection during electroplating) is etched away.

Accordingly, the processing proceeds as follows:

A. Deposit a Cr/Cu/Cr metallization 310, 0.2 to 1.0 micrometer thick, FIG. 3B. Metallization 310 serves to conduct the electrical current during the subsequent electroplating step. The chromium layers are 0.05 μm thick and mainly provide copper adhesion.

B. Mask metallization layer 310 with photoresist 312 (i.e., spin, dry, expose, develop, and hard bake), exposing the metallization where the copper vias or studs are to be built. The thickness of the photoresist should equal the height of the planned copper via to be deposited in apertures 314, FIG. 3C.

C. Selectively etch away the exposed chromium at the bottom of aperture 314, and electroplate copper to fill apertures 314 in photoresist 312. Note the resulting overfill of vias 316, FIG. 3D.

D. Polish via surfaces 318 (using polishing methods described below) and strip photoresist layer 312, then mask the copper lines, vias and studs with new photoresist 320, FIG. 3E.

E. Strip the exposed regions of the thin metallization layer 310 which served to conduct the electroplating current in preceding step C, and strip photoresist 320.

F. Deposit polyimide layer 322. The polyimide deposition process involves dry baking and plasma cleaning the substrate. Next, polyimide precursor solution is spun onto the substrate, and spun dry. Then, the wafer is soft baked to obtain a B-shape polyimide layer 322. Photoresist layer 324 is masked to provide openings 316 atop vias 316, FIG. 3F, and then polyimide bulge 323 atop via 316 is etched back. Photoresist layer 324 is stripped and finally, polyimide layer 322 is cured, FIG. 3G.

Each following intermediate layer of metal circuit paths and interconnecting vias (or studs) is fabricated similarly. The stacked vias shown in FIG. 7 were fabricated according to the above via procedure.

The fine, accurate polishing of the via and dielectric surfaces is a critical procedural step for the present invention. A silicon wafer can be on the order of 100,000 μm across, yet the top layer of the vias and studs (i.e., the irregular layer which needs to be polished flat) can be only 5 μm thick. The thinness, planarity and parallelism of the collective layer of vias/studs and the small amount of material needed to be removed stain conventional methods of polished. In accordance with the invention, a method, tooling and procedure are provided to maintain the silicon substrate, with its newly formed layer of vias and studs, at a slope smaller than 1/100,000 relative to the polishing platen during each mechanical polishing operation.

Figure 6:
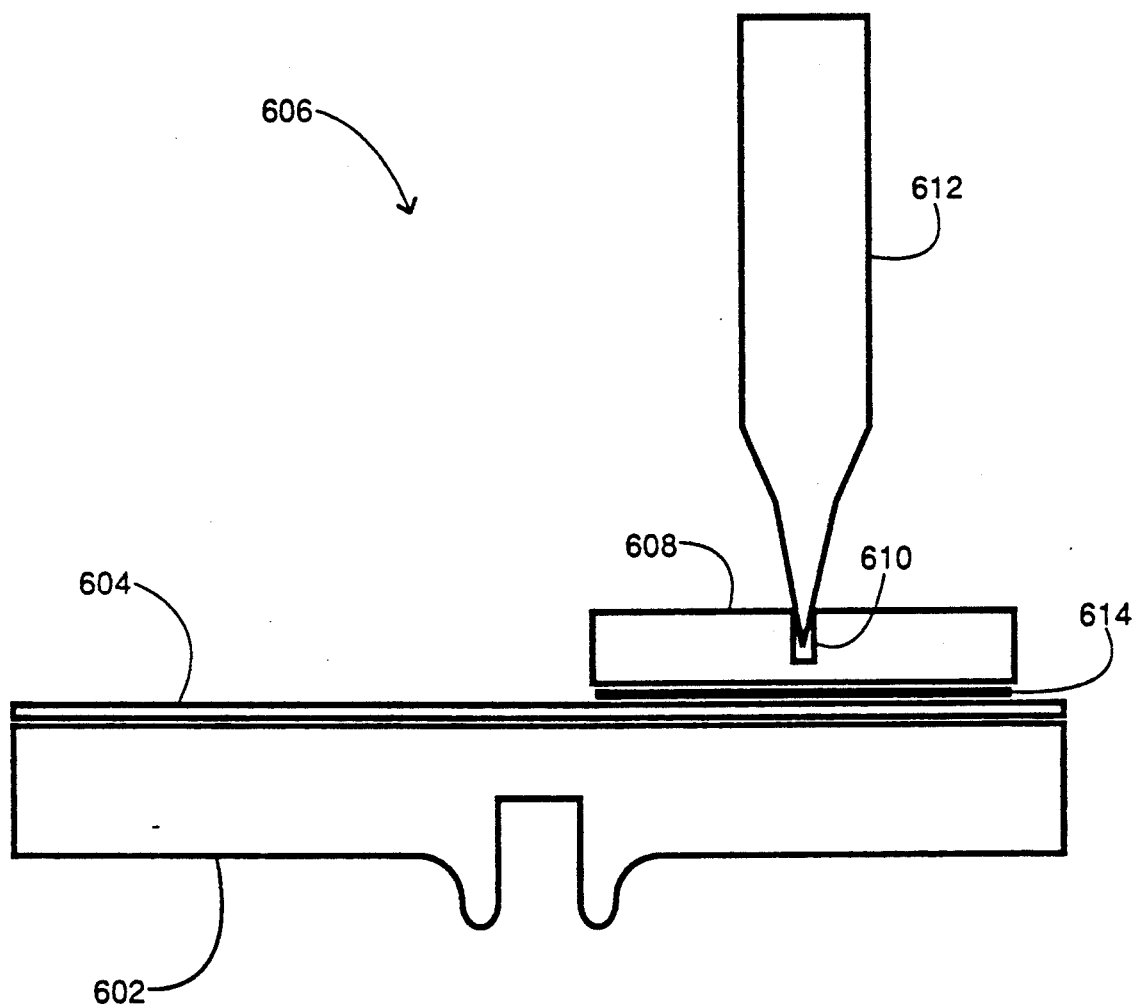
FIG. 6 illustrates the polishing of substrate surfaces with a very high degree of orientation accuracy, using metallographic or wafer polishing equipment, and a substrate holder designed with three degrees of angular freedom which forces the substrate surface to automatically align to the polishing platen surface, in accordance with the invention.

The invention employs a substrate holder designed with three degrees of angular freedom, thus forcing the substrate to automatically of self-align to the rotating polishing platen surface. The self-alignment serves to evenly remove material from the upper surface of the substrate. The equipment and tooling used, as shown in FIG. 6, include the following: a rotating polisher (for example, a Polimet polisher from Buehler, which is not shown), platens 602 and discs 604 bearing the require fine polishing grits for use on the polisher, and a substrate holder 606 with three degrees of angular freedom. There are many ways to design for three degrees of angular freedom.

In one embodiment, the holder comprises a cylindrical mass and a rod. The cylindrical mass 608 can be machined from brass to a diameter somewhat larger (for example, 0.5" larger) than that of the silicon substrate 614. Cylinder 608 has an axial hole 610 (0.17" in diameter, for example), which preferably does not penetrate the entire cylinder. Rod 612 has a tapered end of proper length, such that when rod 612 is inserted into cylinder hole 610, it is stopped by the hole's rounded edge before the end of rod 612 reaches the bottom of hole 610. Other embodiments include alternative designs possessing three angular degrees of freedom such as a ball joint, a universal joint coupled to a bearing, etc.

The polishing and planarizing procedure proceeds as follows. First, the back of substrate 614 is attached against the smooth end of cylinder 608 (i.e., the end surface without the hole). As known in the art, wafers tend to bow as various metal and dielectric layers are added to the silicon substrate. To eliminate the bow during the polishing step, the wafer is laid onto the brass cylinder 608, which has had a thin layer of beeswax applied to its surface. A lint-free cloth separates the upper surface of the wafer 614 from another flat block. The flat block presses and flattens the wafer to the brass cylinder 608 in a heating and cooling step, during which the beeswax melts and attaches the wafer to the cylinder block, resulting in a high degrees of flatness.

Second, the polishing platen rotation speed control is set to zero and the substrate/cylinder assembly is placed face down on the platen, off-center, as shown in FIG. 6. The platens are used in graded sequence from the coarse to the fine polishing grit, with customary cleaning procedures employed at each platen change to avoid cross-contamination. Next, the tapered end of rod 612 is inserted into cylinder hole 610. Holding rod 612 nearly vertically, and using it to control the position of the substrate surface on the platen, the platen rotating speed control is gradually increased from zero to the desired speed. The increase in linear speed with distance form the platen center causes the substrate 614 and cylinder block 608 assembly to rotate, thus distributing the polishing action uniformly over the substrate surface.

After the desired polishing time, the platen rotating speed control is gradually decreased to zero. The assembly is then removed, rinsed, dried and examined. Based upon the examination of the wafer surface, more polishing is carried out at the same grit grade or the sample is thoroughly cleaned in an ultrasonic bath, the platen changed to the next grade, and polishing resumed until polishing is completed.

Figure 4A:
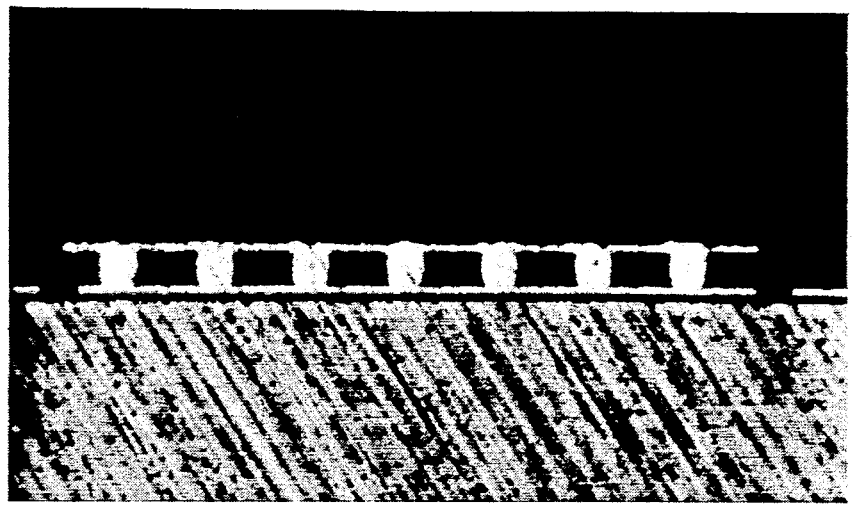
FIGS. 4A and 4B are microscope pictures of the cross section of solid copper vias, 40 microns ($\mu m$) in diameter, 40 $\mu m$ tall built in a polyimide/copper structure in accordance with the present invention, polished using a first planarizing method.
Figure 4B:
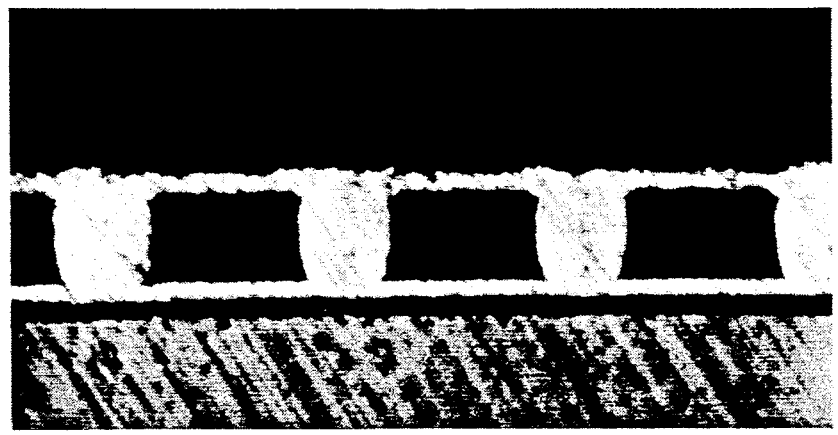

The surfaces of the solid copper vias shown in FIGS. 4A and 4B were fabricated in accordance with the first described fabrication procedure, in accordance with the first polishing method. The above described polishing requires starting with the substrate material initially planarized, but this requirement can be relaxed by the use of padded platen surfaces (which carry the polishing grit).

In accordance with the invention, an alternative mechanical polishing method, tooling and procedure are provided to inherently maintain the substrate during the polishing operation at a slope smaller than 1/100,000 relative to the polishing platen. Instead of holding, the substrate and wafer over a rotating polishing platen, the alternative method employs a substrate holder designed to "flat" the substrate, face down at the desired pressure, on a shaking polishing platen surface such that the substrate surface inherently self-aligns to the shaking platen. The tooling and procedures are described below.

The equipment and tooling for the alternative mechanical polishing includes a shaking polisher (for example from Labtone), a polisher well for each requisite polishing grade grit, a hard flat surface (flat glass, for example) fitting the bottom of each polisher well, and a substrate holder similar to that described above (made from brass, shaped approximately 0.5" larger in diameter than the substrate which it holds). The density and height of the holder determines the polishing pressure.

The alternative mechanical polishing proceeds as follows. First, the back of the substrate is waxed flat against a cylinder end surface of the substrate holder, as described above. Next, the polisher is switched off and the substrate and cylinder assembly is placed face down on the platen. Several such assemblies can be placed on the platen for simultaneous polishing. The wells and hard flat surfaces are used in graded sequence from coarse to fine polishing grit, using customary cleaning procedures at each change to avoid cross-contamination. Then, the polisher is switched on. After the desired polishing time, the polisher is switched off. The assembly is removed, rinsed, dried and examined. Based upon the examination, more polishing is carried out at the same grid grade, or the sample is thoroughly cleaned in an ultrasonic bath, the well and platen changed to the next grade, polishing resumed, and so on until polishing is completed.

Figure 5A:
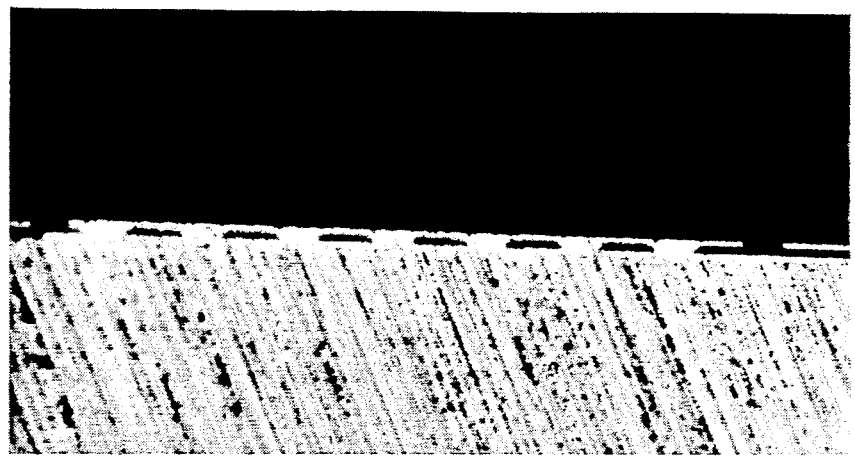
FIGS. 5A and 5B are microscope pictures of the cross section of solid copper vias, 40 $\mu m$ in diameter, 10 $\mu m$ tall built in a polyimide/copper structure in accordance with the present invention, and polished using a second planarizing method.
Figure 5B:

The solid copper vias of FIGS. 5A and 5B were fabricated in accordance with this second polishing procedure. The above described polishing requires starting with the substrate material initially planarized, but this requirement can be relaxed by the use of padded platen surfaces (which carry the polishing grit).

In a third polishing method, tooling and procedures are provided for polishing the final copper layer above the substrate surface without the imposition of the stringent requirements on orientation inherent to the mechanical polishing methods described above. The tooling for the third embodiment includes an acid-resistant plate (for example, of polypropylene), lint-free pieces of cloth soaked with graded strengths of copper etchant (Transene CE-200, as an example), and a substrate holder (for example, a hand-held vacuum chuck).

The third inventive procedure begins by flattening the soaked cloth against the plate surface, while the substrate is held by its back on the vacuum chuck. Next, the substrate/chuck assembly is placed with the substrate face-down on the flattened cloth, and moved about, thus continuously wiping the substrate surface against the soaked cloth. The soaked cloths are used in graded sequence form stronger to weaker etchant stretch. After the desired polishing time, the assembly is removed and immediately rinsed, dried, and examined. Based upon the examination, more polishing is carried out at the same etchant strength or the soaked cloth is changed to the next etchant strength, and polishing resumed that so on until polishing is completed.

Figure 7:
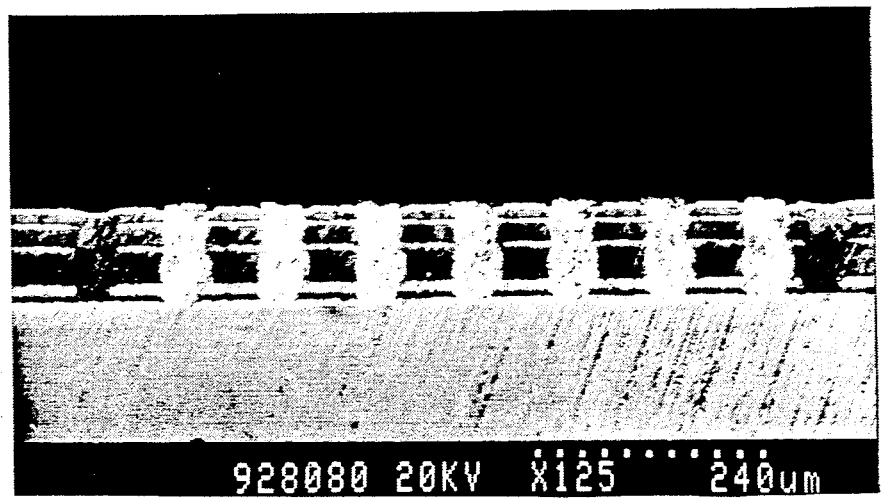
FIG. 7 is a microscope picture of the cross section of four levels of stacked solid copper vias, 40 $\mu m$ in diameter, in a polyimide/copper structure of five metal layers, fabricated in accordance with an alternative embodiment of the present invention, polished using a third planarizing method.

The solid copper vias shown in FIG. 7 were polished in accordance with the third polishing procedure. FIG. 7 shows a microscope picture of the cross section of four levels of stacked solid copper vias, 40 $\mu$m in diameter, in a polyimide/copper structure of five metal (interconnect) layers. The dielectric layers are, from the bottom, 10, 40, 20 and 15 $\mu$m thick, respectively.

The present invention, combining novel via and stud fabrication and polishing techniques, can be applied in the fabrication of integrated circuit chips as well as in the fabrication of multi-chip carriers. As is apparent to those skilled in the art, many modifications to the disclosed embodiment can be made while retaining the essential features of the invention.

The present invention provides for substrates other than silicon, e.g., a metal, a metal with a dielectric layer, or a flexible substrate such as a polyimide film. The lines can be copper, silver, gold, or platinum. The conducting layer can include the same range of metals as the lines, as can the vias. The dielectric layer can be of alumina, silica, etc. The present invention also provides for the use of photosensitive dielectrics. In such a case, the photo-imageable layer used to define the vias can be retained as the dielectric layer. A photosensitive dielectric would thereby eliminate the need for a separate photosensitive mask, by directly masking and developing the dielectric layer. Elector-less plating can be used to form the vias. In this case, the conductive layer below the vias is not required. Accordingly, as an alternative embodiment, it would be neither necessary to deposit this metal nor to remove the portions of it which interconnect lines.

These and other variations upon and modifications to the described embodiments are provided for by the present invention, the scope of which is limited only by the following claims.

What is claimed is:

1. A method of forming an integrated circuit structure including solid vias, said method comprising the sequential steps of:
   a) forming a first circuit pattern on a substrate;
   b) depositing a first dielectric layer;
   c) defining apertures in said first dielectric layer;
   d) depositing a first metallization layer so as to form an upper conductive layer including a plurality of first dielectric layer vias through said apertures, said first dielectric layers being initially hollow, said first metallization layer consisting of a metal conductive layer sandwiched between metal adhesive layers which facilitate bonding to adjacent dielectric layer vias;
   e) depositing a photoresist layer on the structure resulting from step d) and defining apertures in said photoresist layer;
   f) filing said first dielectric layer vias with solid material so that said first dielectric layer vias become solid; and
   g) removing the remainder of said photoresist layer.

2. A method as recited in claim 1 wherein said metal conductive layer copper.

3. A method as recited in claim 2, further comprising forming a second circuit pattern including second circuit layer lines on the structure resulting from step g so that at least one of said second circuit layer lines is stacked on a respective one of said first dielectric layer vias.

4. A method as recited in claim 3 further comprising a second iteration of steps b through g to form a plurality of second dielectric layer vias over said second circuit pattern so that at least one of said second dielectric layer vias is stacked on a respective one of said first dielectric layer vias to form a multiple layer interconnect.

5. A method of forming an integrated circuit structure including solid vias, said method comprising the sequential steps of:
   a) forming a first circuit pattern on a substrate;
   b) depositing a first dielectric layer;
   c) defining apertures in said first dielectric layer;
   d) depositing a first metallization layer so as to form an upper conductive layer including a plurality of first dielectric layer vias through said apertures, said vias being initially hollow, said first metallization layer including a metal conductive layer sandwiched between metal adhesive layer;
   e) depositing a photoresist layer on the structure resulting from step d) and defining apertures in said photoresist layer;
   f) filling said first dielectric layer vias with conductive material so that said first dielectric layer vias become solid;
   g) polishing the structure resulting from step f so as to remove excess solid conductive material so that a composite conductive layer with a planar top surface and integral solid vias remains; and
   h) photolithographically patterning said composite conductive layer so as to define a first upper layer of conductive traces.

6. A method as recited in claim 5 further comprising a second iteration of steps b through h to form a plurality of second dielectric layer vias over said second circuit pattern so that at least one of said second dielectric layer vias is stacked on a respective one of said first dielectric layer vias to form a multiple layer interconnect.

* * * * *